United States Patent
Lomp et al.

(10) Patent No.: US 6,674,788 B2
(45) Date of Patent: *Jan. 6, 2004

(54) AUTOMATIC POWER CONTROL SYSTEM FOR A CODE DIVISION MULTIPLE ACCESS (CDMA) COMMUNICATIONS SYSTEM

(75) Inventors: Gary Lomp, Centerpot, NY (US); Fatih Ozluturk, Port Washington, NY (US); John Kowalski, Hempstead, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/083,846

(22) Filed: Feb. 27, 2002

(65) Prior Publication Data

US 2002/0118722 A1 Aug. 29, 2002

Related U.S. Application Data

(63) Continuation of application No. 09/833,285, filed on Apr. 12, 2001, which is a continuation of application No. 09/406,162, filed on Sep. 27, 2001, now abandoned, which is a continuation of application No. 08/669,770, filed on Jun. 27, 1996, now Pat. No. 5,991,329.
(60) Provisional application No. 60/000,775, filed on Jun. 30, 1995.

(51) Int. Cl.[7] .................................................. H04B 1/69
(52) U.S. Cl. ...................... 375/130; 375/146; 455/522; 455/69; 370/342
(58) Field of Search ................................. 375/130, 148, 375/146; 455/69, 522; 370/342, 335

(56) References Cited

U.S. PATENT DOCUMENTS 4,320,513 A    3/1982   Lampert
4,901,307 A    2/1990   Gilhousen et al.
5,022,049 A    6/1991   Abrahamson et al.

(List continued on next page.)

FOREIGN PATENT DOCUMENTS

| DE | 3743731 A1 | 7/1989 |
| DE | 3743732 A1 | 7/1989 |
| EP | 0462572 A  | 12/1991 |

(List continued on next page.)

OTHER PUBLICATIONS

Pahlavan et al.; "Performance of adaptive matched filter receivers over fading multipath channels;" IEEE; vol. 38, No. 12; pp. 2106–2113; Dec. 1990.

Giannetti et al.; "Design of an all–digital receiver for narrowband continuous–phase asynchronous CDMA systems;" IEEE; vol. 3; pp. 468–472; May 1993.

(List continued on next page.)

*Primary Examiner*—Temesghen Ghebretinsae
(74) *Attorney, Agent, or Firm*—Volpe and Koenig, P.C.

(57) ABSTRACT

A method and apparatus for communication data signal blocking for a base radio control station (RCS) which wirelessly communicates with subscriber units (SUs) via a spread spectrum communication system is disclosed. A transmitter sends signals as a baseband combined signal over global and assigned channels to SUs. The SUs are set to initial power levels and the power levels are adjusted in advance of receiving signals on assigned channels. The power levels are combined to define an RCS transmitter power level, which is preferably a root mean square value of the baseband combined signal. The transmission power levels are adjusted in response to corresponding power control signals received from the SUs. Transmission of a new communication data signal on an assigned channel is blocked if a predetermined RCS transmitter power level limit is reached before commencing transmission of that signal.

14 Claims, 8 Drawing Sheets

U.S. PATENT DOCUMENTS

| | | |
|---|---|---|
| 5,084,900 A | 1/1992 | Taylor |
| 5,093,840 A | 3/1992 | Schilling |
| 5,103,459 A | 4/1992 | Gilhousen et al. |
| 5,109,390 A | 4/1992 | Gilhousen et al. |
| 5,166,951 A | 11/1992 | Schilling |
| 5,166,952 A | 11/1992 | Omurg et al. |
| 5,193,094 A | 3/1993 | Viterbi |
| 5,204,876 A | 4/1993 | Bruckert et al. |
| 5,228,054 A | 7/1993 | Rueth et al. |
| 5,228,056 A | 7/1993 | Schilling |
| 5,237,586 A | 8/1993 | Bottomley |
| 5,241,690 A | 8/1993 | Larsson et al. |
| 5,245,629 A | 9/1993 | Hall |
| 5,253,268 A | 10/1993 | Omura et al. |
| 5,257,283 A | 10/1993 | Gilhousen et al. |
| 5,260,967 A | 11/1993 | Schilling |
| 5,265,119 A | 11/1993 | Gilhousen et al. |
| 5,267,262 A | 11/1993 | Wheatley, III |
| 5,283,536 A | 2/1994 | Wheatley, III et al. |
| 5,295,152 A | 3/1994 | Gudmundson et al. |
| 5,299,226 A | 3/1994 | Schilling |
| 5,299,228 A | 3/1994 | Hall |
| 5,309,474 A | 5/1994 | Gilhousen et al. |
| 5,327,455 A | 7/1994 | DeGaudenzi et al. |
| 5,327,467 A | 7/1994 | DeGaudenzi et al. |
| 5,341,396 A | 8/1994 | Higgins et al. |
| 5,345,598 A | 9/1994 | Dent |
| 5,347,536 A | 9/1994 | Meehan |
| 5,349,606 A | 9/1994 | Lovell et al. |
| 5,361,276 A | 11/1994 | Subramanian |
| 5,365,585 A | 11/1994 | Puhl et al. |
| 5,377,183 A | 12/1994 | Dent |
| 5,392,287 A | 2/1995 | Tiedemann, Jr. et al. |
| 5,396,516 A | 3/1995 | Padovani et al. |
| 5,396,539 A | 3/1995 | Slekys et al. |
| 5,404,376 A | 4/1995 | Dent |
| 5,414,728 A | 5/1995 | Zehavi |
| 5,414,729 A | 5/1995 | Fenton |
| 5,416,797 A | 5/1995 | Gilhousen et al. |
| 5,420,864 A | 5/1995 | Dahlin et al. |
| 5,420,896 A | 5/1995 | Schilling |
| 5,430,760 A | 7/1995 | Dent |
| 5,440,597 A | 8/1995 | Chung et al. |
| 5,442,662 A | 8/1995 | Fukasawa et al. |
| 5,459,759 A | 10/1995 | Schilling |
| 5,488,629 A | 1/1996 | Takahashi et al. |
| 5,519,736 A | 5/1996 | Ishida |
| 5,559,790 A | 9/1996 | Yano et al. |
| 5,654,980 A | 8/1997 | Latva-aho et al. |
| 5,657,343 A | 8/1997 | Schilling |
| 5,872,810 A | 2/1999 | Phillips et al. |
| 5,875,400 A | 2/1999 | Madhavapeddy et al. |
| 5,878,329 A | 3/1999 | Mallinckrodt |
| 5,881,368 A * | 3/1999 | Grob et al. .................. 455/69 |

FOREIGN PATENT DOCUMENTS

| | | |
|---|---|---|
| EP | 0464839 A2 | 1/1992 |
| EP | 0526106 A2 | 2/1993 |
| EP | 0631397 A | 12/1994 |
| EP | 0654913 A2 | 5/1995 |
| EP | 0656716 A1 | 6/1995 |
| EP | 0668662 A1 | 8/1995 |
| GB | 2280575 | 2/1995 |
| WO | 9221196 | 11/1992 |
| WO | WO9307702 | 4/1993 |
| WO | 9314588 | 7/1993 |
| WO | 9428640 | 12/1994 |
| WO | WO9503652 | 2/1995 |
| WO | WO9507578 | 3/1995 |
| WO | WO9702665 | 1/1997 |

OTHER PUBLICATIONS

Braun et al.; "An All–digital receiver for satellite audio broadcasting signals using trellis coded quasi–orthogonal code–division multiplexing," AEI; vol. 4, No. 1; pp. 23–32; 1993.

Rick et al.; "Noncoherent parallel acquisition in CDMA spread spectrum systems;" IEEE; paragraph 1; May 1994.

Bernasconi; "Receiver architectures for the down–link in a DS–CDMA mobile system;" IEEE; pp. 51–55; Sep. 1994.

Hossein Al Avi, "Power Control and Interference Management in a Spread–Spectrum Cellular Mobile Radio System," UMI Dissertation Information Service, (1984) 129 pp.

"Code Division Multiple Access (CDMA)", Franz Josef Hagmanns, Volker Hespelt, 8273 ANT Nachrichtentechnische Berichte (1993) Aug., No. 10, Backnang, DE, pp. 64–71.

CDMA and ATM–zwei Technologien, ein Ziel:, 2323 Telcom Report (Siemens) 18(1995) Maerz/Apr., No. 2 Munchen, DE, pp. 60–63.

Zhao Liu et al., "SIR–Based Call Admission Control for DS–CDMA Cellular Systems", IEEE Journal on Selected Areas in Communications, US, IEEE Inc. New York, vol. 12, No. 4, May 1, 1994, pp. 638–644.

* cited by examiner

AUTOMATIC POWER CONTROL SYSTEM FOR A CODE DIVISION MULTIPLE ACCESS (CDMA) COMMUNICATIONS SYSTEM

CROSS-REFERENCE TO RELATED APPLICATIONS

This application is a continuation of U.S. patent application Ser. No. 09/833,285, filed Apr. 12, 2001, which is a continuation of U.S. patent application Ser. No. 09/406,162, filed Sep. 27, 1999, now abandoned, which is a continuation of U.S. patent application Ser. No. 08/669,770, filed Jun. 27, 1996, now U.S. Pat. No. 5,991,329 issued Nov. 23, 1999, which claims priority from Provisional Patent Application No. 60/000,775, filed Jun. 30, 1995, which applications are incorporated herein by reference.

BACKGROUND OF THE INVENTION

Providing quality telecommunication services to user groups which are classified as remote such as rural telephone systems and telephone systems in developing countries, has proved to be a challenge over recent years. These needs have been partially satisfied by wireless radio services, such as fixed or mobile frequency division multiplex (FDM), frequency division multiple access (FDMA), time division multiplex (TDM), time division multiple access (TDMA) systems, combination frequency and time division systems (FD/TDMA), and other land mobile radio systems. Usually, these remote services are faced with more potential users than can be supported simultaneously by their frequency or spectral bandwidth capacity.

Recognizing these limitations, recent advances in wireless communications have used spread spectrum modulation techniques to provide simultaneous communication by multiple users through a single communications channel. Spread spectrum modulation refers to modulating a information signal with a spreading code signal: the spreading code signal being generated by a code generator where the period Tc of the spreading code is substantially less than the period of the information data bit or symbol signal. The code may modulate the carrier frequency upon which the information has been sent, called frequency-hopped spreading, or may directly modulate the signal by multiplying the spreading code with the information data signal, called direct-sequence spreading (DS). Spread-spectrum modulation produces a signal having a bandwidth that is substantially greater than that required to transmit the information signal. Synchronous reception and despreading of the signal at the receiver demodulator recovers the original information. The synchronous demodulator uses a reference signal to synchronize the despreading circuits to the input spread-spectrum modulated signal to recover the carrier and information signals. The reference signal can be a spreading code which is not modulated by an information signal. Such use of a synchronous spread-spectrum modulation and demodulation for wireless communication is described in U.S. Pat. No. 5,228,056 entitled SYNCHRONOUS SPREAD-SPECTRUM COMMUNICATIONS SYSTEM AND METHOD by Donald L. Schilling, which is incorporated herein by reference.

Spread-spectrum modulation in wireless networks offers many advantages because multiple users may use the same frequency band with minimal interference to each user's receiver. In addition, spread spectrum modulation reduces effects from other sources of interference. Also, synchronous spread-spectrum modulation and demodulation techniques may be expanded by providing multiple message charmels for a user, each spread with a different spreading code, while still transmitting only a single reference signal to the user. Such use of multiple message In channels modulated by a family of spreading codes synchronized to a pilot spreading code for wireless communication is described in U.S. Pat. No. 5,166,951 entitled HIGH CAPACITY SPREAD-SPECTRUM CHANNEL by Donald L. Schilling, which is incorporated herein by reference.

Another problem associated with multiple access, spread-spectrum communication systems is the need to reduce the total transmitted power of users in the system, since users may have limited available power. An associated problem requiring power control in spread-spectrum systems is related to the inherent characteristic of spread-spectrum systems that one user's spread-spectrum signal is received by another user as noise with a certain power level. Consequently, users transmitting with high levels of signal power may interfere with other users' reception. Also, if a user moves relative to another user's geographic location, signal fading and distortion require that the users adjust their transmit power level to maintain a particular signal quality, and to maintain the power that the base station receives from all users. Finally, because it is possible for the spread-spectrum system to have more remote users than can be supported simultaneously, the power control system should also employ a capacity management method which rejects additional users when the maximum system power level is reached.

Prior spread-spectrum systems have employed a base station that measures a received signal and sends an adaptive power control (APC) signal to the remote users. Remote users include a transmitter with an automatic gain control (AGC) circuit which responds to the APC signal. In such systems the base station monitors to the overall system power or the power received from each user, and sets the APC signal accordingly. Such a spread-spectrum power control system and method is described in U.S. Pat. No. 5,299,226 entitled ADAPTIVE POWER CONTROL FOR A SPREAD SPECTRUM COMMUNICATION SYSTEM AND METHOD, and U.S. Pat. No. 5,093,840 entitled ADAPTIVE POWER CONTROL FOR A SPREAD SPECTRUM TRANSMITTER, both by Donald L. Schilling and incorporated herein by reference. This open loop system performance may be improved by including a measurement of the signal power received by the remote user from the base station, and transmitting an APC signal back to the base station to effectuate a closed loop power control method. Such closed loop power control is described, for 2) example, in U.S. Pat. No. 5,107,225 entitled HIGH DYNAMIC RANGE CLOSED LOOP AUTOMATIC GAIN CONTROL CIRCUIT to Charles E. Wheatley, III et al. and incorporated herein by reference.

These power control systems, however, exhibit several disadvantages. First, the base station must perform complex power control algorithms, increasing the amount of processing in the base station. Second, the system actually experiences several types of power variation: variation in the noise power caused by changing numbers of users and variations in the received signal power of a particular bearer channel. These variations occur with different frequency, so simple power control algorithms can be optimized only to one of the two types of variation. Finally, these power algorithms tend to drive the overall system power to a relatively high level. Consequently, there is a need for a spread-spectrum power control method that rapidly responds to changes in bearer channel power levels, while simultaneously making adjustments to all users' transmit power in response to changes in the number of users. Also, there is a need for an improved spread-spectrum communication system employing a closed loop power control system which minimizes the system's overall power requirements while maintaining a sufficient BER at the individual remote receivers. In addition, such a system should control the initial transmit power level of a remote user and manage total system capacity.

SUMMARY OF THE INVENTION

A method and apparatus for communication data signal blocking for a base radio control station (RCS) which wirelessly communicates with subscriber units (SUs) via a spread spectrum communication system is disclosed. A transmitter sends signals as a baseband combined signal over global and assigned channels to SUs. The SUs are set to initial power levels and the power levels are adjusted in advance of receiving signals on assigned channels. The power levels are combined to define an RCS transmitter power level, which is preferably a root mean square value of the baseband combined signal. The transmission power levels are adjusted in response to corresponding power control signals received from the SUs. Transmission of a new communication data signal on an assigned channel is blocked if a predetermined RCS transmitter power level limit is reached before commencing transmission of that signal.

A base radio control station (RCS) having subscriber unit (SU) blocking control, for wireless communication with multiple SUs in a spread spectrum communication system using code division multiple access, includes a transmitter, a receiver, and control circuitry. The transmitter sends signals as a baseband combined signal over global and assigned channels to SUs. The SUs are set to initial power levels and the power levels are adjusted in advance of receiving signals on assigned channels. The power levels are combined to define an RCS transmitter power level, which is preferably a root mean square value of the baseband combined signal. The receiver includes associated circuitry for controlling the power levels of the transmitted signals in response to corresponding power control signals received from the SUs. The control circuitry monitors the RCS transmitter power level and controls the transmitter such that transmission of a new communication data signal on an assigned channel is blocked if a predetermined RCS transmitter power level limit is reached before commencing transmission of the new communication data signal.

BRIEF DESCRIPTION OF THE DRAWING(S)

DETAILED DESCRIPTION OF THE PREFERRED EMBODIMENT(S)

The system of the present invention provides local-loop telephone service using radio link between one or more base stations and multiple remote subscriber units. In the exemplary embodiment, one radio link is described for a base station communicating with a fixed subscriber unit (FSU), but the system is equally applicable to systems including multiple base stations with radio links to both FSUs and Mobile Subscriber Units (MSUs). Consequently, the remote subscriber units are referred to herein as Subscriber Units (SUs).

Figure 1:
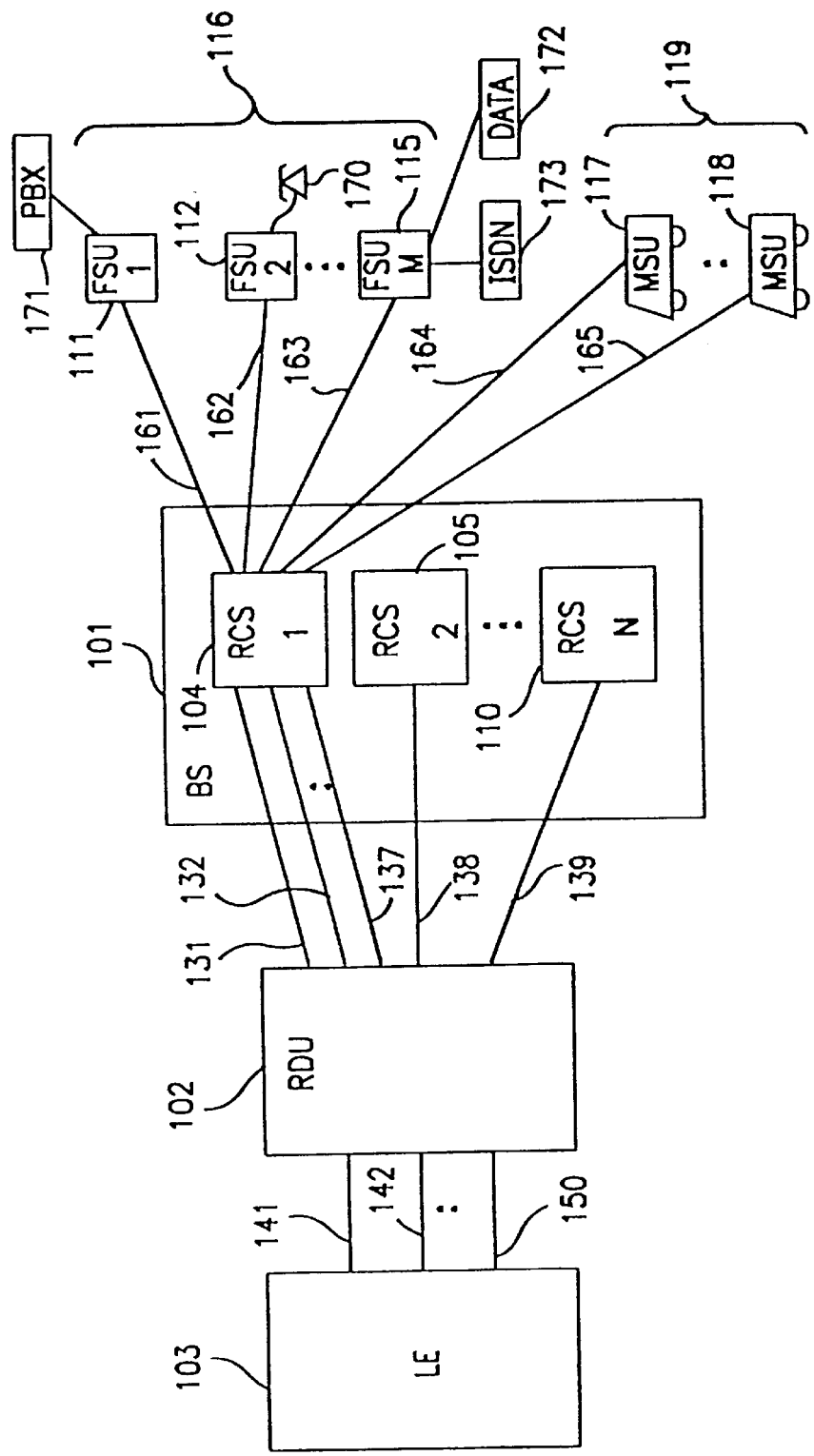
FIG. 1 is a block diagram of a code division multiple access communication system according to the present invention.

Referring to FIG. 1, Base Station (BS) 101 provides call connection to a local exchange (LE) 103 or any other telephone network switching interface, and includes a Radio Carrier Station (RCS) 104. One or more RCSs 104, 105, 110 connect to a Radio Distribution Unit (RDU) 102 through links 131, 132, 137, 138, 139, and RDU 102 interfaces with LE 103 by transmitting and receiving call set-up, control, and information signals through telco links 141, 142, 150. SUs 116, 119 communicate with the RCS 104 through RF links 161, 162, 163, 164, 165. Alternatively, another embodiment of the invention includes several SUs and a "master" SU with functionality similar to the RCS. Such an embodiment may or may not have connection to a local telephone network.

Although the described embodiment uses different spread-spectrum bandwidths centered around a carrier for the transmit and receive spread-spectrum channels, the present method is readily extended to systems using multiple spread-spectrum bandwidths for the transmit channels and multiple spread-spectrum bandwidths for the receive channels. Alternatively, because spread-spectrum communication systems have the inherent feature that one user's transmission appears as noise to another user's despreading receiver, an embodiment can employ the same spread-spectrum channel for both the transmit and receive path channels. In other words, Uplink and Downlink transmissions can occupy the same frequency band. An embodiment of the invention may also employ multiple spread spectrum channels which need not be adjacent in frequency. In this embodiment, any channel may be used for Uplink, Downlink or Uplink and Downlink transmission.

In the exemplary embodiment, the spread binary symbol information is transmitted over the radio links 161 to 165 using Quadrature Phase Shift Keying (QPSK) modulation with Nyquist Pulse Shaping, although other modulation techniques may be used, including, but not limited to, Offset QPSK (OQPSK). Minimum Shift Keying (MSK), M-ary Phase Shift Keying (MPSK) and Gaussian Phase Shift Keying (GPSK).

The CDMA demodulator in either the RCS or the SU despreads the received signal with appropriate processing to combat or exploit multipath propagation effects. Parameters (concerning the received power level are used to generate the Automatic Power Control (APC) information which, in turn, is transmitted to the other end. The APC information is used to control transmit power of the automatic forward power control (AFPC) and automatic reverse power control (ARPC) links. In addition, each RCS 104, 105 and 110 can perform Maintenance Power Control (MPC), in a manner similar to APC, to adjust the initial transmit power of each SU 111, 112, 115, 117 and 118. Demodulation is coherent where the pilot signal provides the phase reference.

The transmit power levels of the radio interface between RCS 104 and SUs 111, 112, 115, 117 and 118 are controlled using two different closed loop power control algorithms. The Automatic Forward Power Control (AFPC) determines the Downlink transmit power level, and the Automatic Reverse Power Control (ARPC) determines the Uplink transmit power level. The logical control channel by which SU 111 and RCS 104, for example, transfer power control information operates at least a 16 kHz update rate. Other embodiments may use a faster 32 kHz update rate. These algorithms ensure that the transmit power of a user maintains an acceptable Bit-Error Rate (BER), maintains the system power at a minimum to conserve power, and maintains the power level of all SUs 111, 112, 115, 117 and 118. as received by RCS 104, at a nearly equal level.

In addition, the system includes an optional maintenance power algorithm that is used during the inactive mode of a SU. When SU 111 is inactive or powered-down to conserve power, the unit may occasionally activate itself and adjust its initial transmit power level setting in response to a maintenance power control signal from RCS 104. The maintenance power signal is determined by the RCS 104 by measuring the received power level of SU 111 and present system power level and calculating the necessary initial transmit power. The method shortens the channel acquisition time of SU 111 when it is turned on to begin a communication. The method also prevents the transmit power level of SU 111 from becoming too high and interfering with other channels during the initial transmission before the closed loop power control adjusts the transmit power to a level appropriate for the other message traffic in the channel.

The RCS 104 obtains synchronization of its clock from an interface line such as, but not limited to, E1, T1, or HDSL interfaces. Each RCS can also generate its own internal clock signal from an oscillator which may be regulated by a Global Positioning System (GPS) receiver. The RCS 104 generates a Global Pilot Code for a channel having a spreading code but no data modulation, which can be acquired by remote SUs 111 through 118. All transmission channels of the RCS are synchronous with the Pilot channel, and spreading code phases of code generators (not shown) used for Logical communication channels within RCS 104 are also synchronous with the Pilot channel's spreading code phase. Similarly, SUs 111 through 118 which receive the Global Pilot Code of RCS 104 synchronize the spreading and de-spreading code phases of the code generators (not shown) of the SUs to the Global Pilot Code.

Logical Communication Channels

A 'channel' of the prior art is usually regarded as a communications path that is part of an interface and that can be distinguished from other paths of the interface without regard to its content. In the case of CDMA, however, separate communications paths are distinguished only by their content. The term 'logical channel' is used to distinguish the separate data streams, which are logically equivalent to channels in the conventional sense. All logical channels and sub-channels of the present invention are mapped to a common 64 kilo-symbols per second (ksym/s) QPSK stream. Some channels are synchronized to associated pilot codes which are generated and perform a similar function to the system Global Pilot Code. The system pilot signals, are not, however, considered logical channels.

Several logical communication channels are used over the RF communication link between the RCS and SU. Each logical communication channel either has a fixed, pre-determined spreading code or a dynamically assigned spreading code. For both pre-determined and assigned codes, the code phase is synchronous with the Pilot Code. Logical communication channels are divided into two groups: the Global Channel (GC) group and the Assigned Channel (AC) group. The GC group includes channels which are either transmitted from the base station RCS to all the remote SUs or from any SU to the RCS of the base station regardless of the SU's identity. These channels typically contain information of a given type for all users. These channels include the channels used by the SUs to gain system access. Channels in the Assigned Channels (AC) group are those channels dedicated to communication between the RCS and a particular SU.

Power Control

General

The power control feature of the present invention is used to minimize the transmit power used between an RCS and any SUs with which it is in communication. The power control subfeature that updates transmit power during bearer channel connection is defined as automatic power control (APC). APC data is transferred from the RCS to an SU on the forward APC channel and from an SU to the RCS on the reverse APC channel. When there is no active data link between the two, the maintenance power control subfeature (MPC) controls the transmit to power of the SU.

Transmit power levels of forward and reverse assigned channels and reverse global channels are controlled by the APC algorithm to maintain sufficient signal power to interference noise power ratio (SIR) on those channels, and to stabilize and minimize system output power. The present invention uses a closed loop power control system in which a receiver controls its associated transmitter to incrementally raise or lower its transmit power. This control is conveyed to the associated transmitter via the power control signal on the APC channel. The receiver makes the decision to increase or decrease the transmitter's power based on two error signals. One error signal is an indication of the difference between the measured and required despread signal powers, and the other error signal is an indication of the average received total power.

As used in the described embodiment of the invention, the term near-end power control is used to refer to adjusting the transmitter's output power in accordance with the APC signal received on the APC channel from the other end. This means the reverse power control for the SU and forward power control for the RCS; and the term far-end APC is used to refer to forward power control for the SU and reverse power control for the RCS (adjusting the transmit power of the unit at the opposite end of the channel).

In order to conserve power, the SU modem terminates transmission and powers-down while waiting for a call, defined as the sleep phase. Sleep phase is terminated by an awaken signal from the SU controller. Responsive to this signal, the SU modem acquisition circuit automatically enters the reacquisition phase, and begins the process of acquiring the downlink pilot, as described below.

Closed Loop Power Control Algorithms

The near-end power control includes two steps: first, set the initial transmit power, second, continually adjust transmit power according to information received from the far-end using APC.

For the SU, initial transmit power is set to a minimum value and then ramped up, for example, at a rate of 1 dB/ms until either a ramp-up timer expires (not shown) or the RCS changes the corresponding traffic light value on the FBCH to "red" indicating the RCS has locked to the SU's short pilot signal (SAXPT). Expiration of the timer causes the SAXPT transmission to be shut down, unless the traffic light value is set to red first, in which case the SU continues to ramp-up transmit power but at a much lower rate than before the "red" signal was detected.

The initial power ramp-up method is described in U.S. Pat. No. 5,841,768, entitled A METHOD OF CONTROLLING INITIAL POWER RAMP-UP IN CDMA SYSTEMS BY USING SHORT CODES, which is hereby incorporated by reference.

For the RCS, initial transmit power is set at a fixed value, corresponding to the minimum value necessary for reliable operation as determined experimentally for the service type and the current number of system users. Global channels, such as the Global Pilot or, the fast broadcast channel (FBCH), are always transmitted at the fixed initial power, whereas traffic channels are switched to APC.

The APC signal is transmitted as one bit signals on the APC channel. The one-bit signal represents a command to increase (signal is logic-high) or decrease (signal is logic-low) the associated transmit power. In the described embodiment, the 64 kbps APC data stream is not encoded or interleaved.

Far-end power control consists of the near-end transmitting power control information for the far-end to use in adjusting its transmit power.

The APC algorithm causes the RCS or the SU to transmit +1 if the following inequality holds, otherwise −1 (logic-low).

$$\alpha_1 e_1 - \alpha_2 e_2 > 0 \quad (1)$$

Here the error signal $e_1$ is calculated as $$e_1 = P_d - (1 + SNR_{REF})P_N \quad (2)$$

where $P_d$ is the despread signal plus noise power, $P_N$ is the despread noise power, and $SNR_{REF}$ is the desired despread signal to noise ratio for the particular service type; and $$e_2 = P_r - P_o \quad (3)$$

where Pr is a measure of the received power and Po is the automatic gain control (AGC) circuit set point. The weights $\alpha_1$ and $\alpha_2$ in equation (30) are chosen for each service type and for the APC update rate.

Maintenance Power Control

During the sleep phase of the SU, the interference noise power of the CDMA RF channel changes. As an alternative to the initial power ramp-up method described above, the present invention may include a maintenance power control feature (MPC) which periodically adjusts the SU's initial transmit power with respect to the interference noise power of the CDMA channel. The MPC is the process whereby the transmit power level of an SU is maintained within close proximity of the minimum level required for the RCS to detect the SU's signal. The MPC process compensates for low frequency changes in the required SU transmit power.

The maintenance control feature uses two global channels: one is called the status channel (STCH) on reverse link, and the other is called the check-up channel (CUCH) on forward link. The signals transmitted on these channels carry no data and they are generated the same way the short codes used in initial power ramp-up are generated. The STCH and CUCH codes are generated from a "reserved" branch of the global code generator.

The MPC process is as follows. At random intervals, the SU sends a symbol length spreading code periodically for 3 ms on the status channel (STCH). If the RCS detects the sequence, it replies by sending a symbol length code sequence within the next 3 ms on the check-up channel (CUCH). When the SU detects the response from the RCS, it reduces its transmit power by a particular step size. If the SU does not detect any response from the RCS within the 3 ms period, it increases its transmit power by the step size. Using this method, the RCS response is transmitted at a power level that is enough to maintain a 0.99 detection probability at all SU's.

The rate of change of traffic load and the number of active users is related to the total interference noise power of the CDMA channel. The update rate and step size of the maintenance power update signal for the present invention is determined by using queuing theory methods well known in the art of communication theory, such as outlined in "Fundamentals of Digital Switching" (Plenum-New York) edited by McDonald and incorporated herein by reference. By modeling the call origination process as an exponential random variable with mean 6.0 mins, numerical computation shows the maintenance power level of a SU should be updated once every 10 seconds or less to be able to follow the changes in interference level using 0.5 dB step size. Modeling the call origination process as a Poisson random variable with exponential interarrival times, arrival rate of $2 \times 10^{-4}$ per second per user, service rate of $1/360$ per second, and the total subscriber population is 600 in the RCS service area also yields by numerical computation that an update rate of once every 10 seconds is sufficient when 0.5 dB step size is used.

Figure 2:
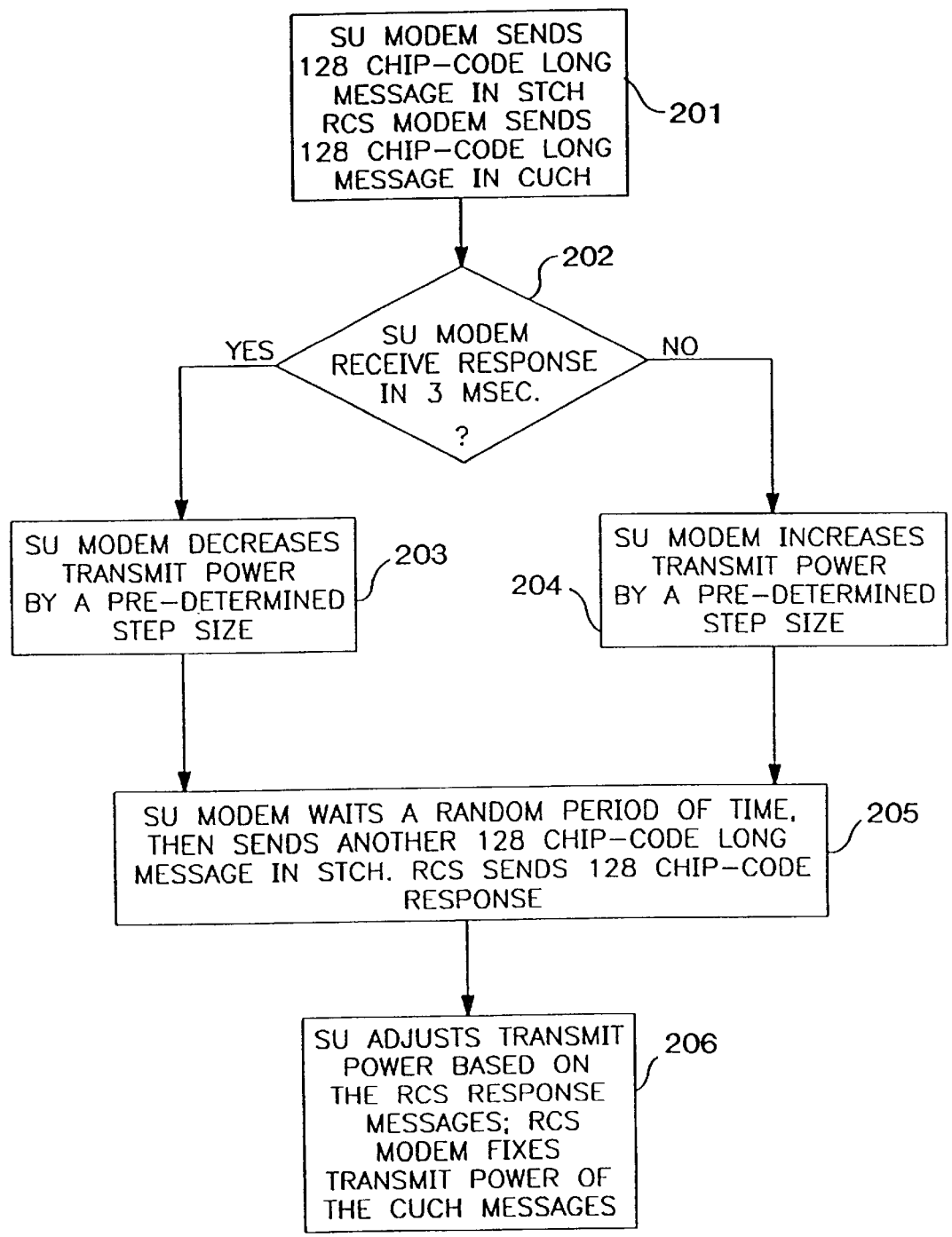
FIG. 2 is a flow-chart diagram of an exemplary maintenance power control algorithm of the present invention.

Maintenance power adjustment is performed periodically by the SU which changes from sleep phase to awake phase and performs the MPC process. Consequently, the process for the MPC feature is shown in FIG. 2 and is as follows: First, at step 201, signals are exchanged between the SU and the RCS maintaining a transmit power level that is close to the required level for detection: the SU periodically sends a symbol length spreading code in the STCH, and the RCS sends periodically a symbol length spreading code in the CUCH as response.

Next, at step 202, if the SU receives a response within 3 ms after the STCH message it sent, it decreases its transmit power by a particular step size at step 203; but if the SU does not receive a response within 3 ms after the STCH message, it increases its transmit power by the same step size at step 204.

The SU waits, at step 205, for a period of time before sending another STCH message, this time period is determined by a random process which averages 10 seconds.

Thus, the transmit power of the STCH messages from the SU is adjusted based on the RCS response periodically, and the transmit power of the CUCH messages from the RCS is fixed.

Mapping of Power Control Signal to Logical Channels For APC

Power control signals are mapped to specified Logical Channels for controlling transmit power levels of forward and reverse assigned channels. Reverse global channels are also controlled by the APC algorithm to maintain sufficient signal power to interference noise power ratio (SIR) on those reverse channels, and to stabilize and minimize system output power. The present invention uses a closed loop power control method in which a receiver periodically decides to incrementally raise or lower the output power of the transmitter at the other end. The method also conveys that decision back to the respective transmitter.

TABLE 1

APC Signal Channel Assignments

| Link Channels and Signals | Call/Connection Status | Power Control Method | |
|---|---|---|---|
| | | Initial Value | Continuous |
| Reverse link AXCH AXPT | Being Established | as determined by power ramping | APC bits in forward APC channel |
| Reverse link APC, OW, TRCH, pilot signal | In-Progress | level established during call set-up | APC bits in forward APC channel |
| Forward link APC, OW, TRCH | In-Progress | fixed value | APC bits in reverse APC channel |

Forward and reverse links are independently controlled. For a call/connection in process, forward link traffic channel (TRCH) APC, and Order Wire (OW) power is controlled by the APC bits transmitted on the reverse APC channel. During the call/connection establishment process, reverse link access channel (AXCH) power is also controlled by the APC bits transmitted on the forward APC channel. Table 1 summarizes the specific power control methods for the controlled channels.

The required SIRs of the assigned channels TRCH, APC and OW and reverse assigned pilot signal for any particular SU are fixed in proportion to each other and these channels are subject to nearly identical fading, therefore, they are power controlled together.

Automatic Forward Power Control

Figure 3:
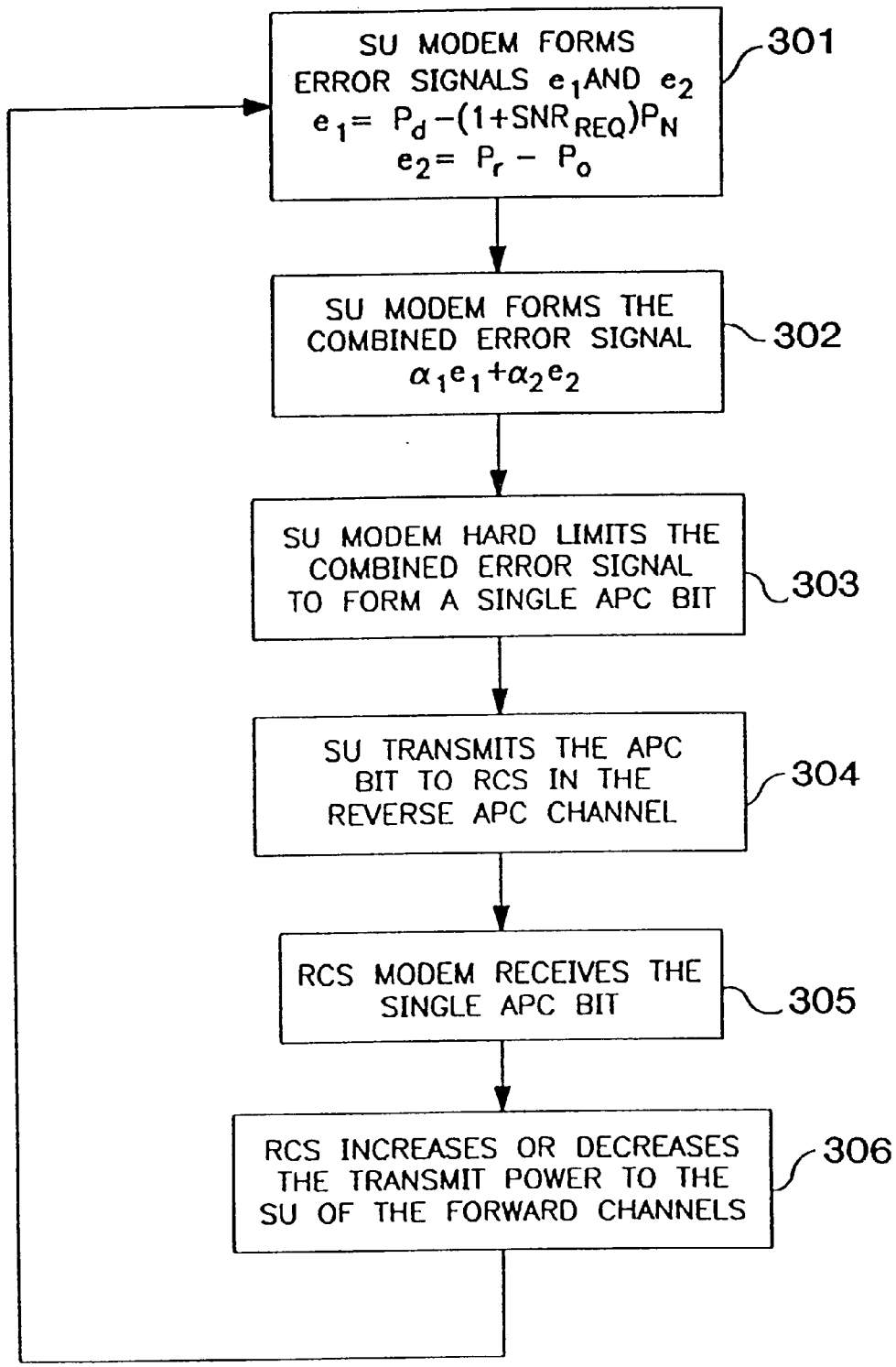
FIG. 3 is a flow-chart diagram of an exemplary automatic forward power control algorithm of the present invention.

The AFPC system attempts to maintain the minimum required SIR on the forward channels during a call/connection. The AFPC recursive process shown in FIG. 3 consists of the steps of having an SU form the two error signals $e_1$ and $e_2$ in step 301 where $$e_1 = P_d - (1 + SNR_{REQ})P_N \quad (4)$$

$$e_2 = P_r - P_o \quad (5)$$

and $P_d$ is the despread signal plus noise power, $P_N$ is the despread noise power, $SNR_{REF}$ is the required signal to noise ratio for the service type, $P_r$ is a measure of the total received power, and $P_o$ is the AGC set point. Next, the SU modem forms the combined error signal $\alpha_1 e_1 + \alpha_2 e_2$ in step 302. Here, the weights $\alpha_1$ and $\alpha_2$ are chosen for each service type and APC update rate. In step 303, the SU hard limits the combined error signal and forms a single APC bit. The SU transmits the APC bit to the RCS in step 304 and RCS modem receives the bit in step 305. The RCS increases or decreases its transmit power to the SU in step 306 and the algorithm repeats starting from step 301.

Automatic Reverse Power Control

Figure 4:
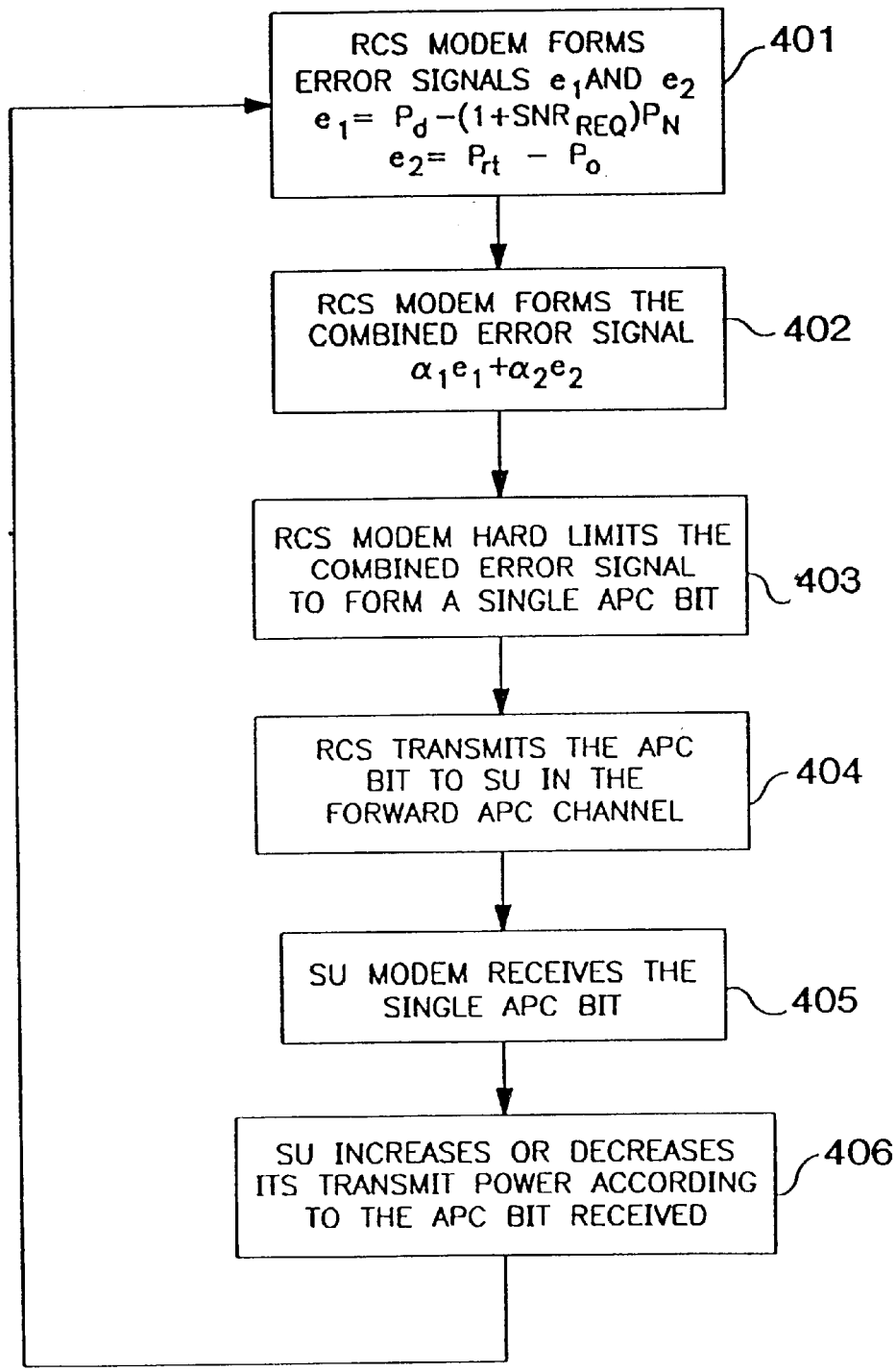
FIG. 4 is a flow-chart diagram of an exemplary automatic reverse power control algorithm of the present invention.

The ARPC system maintains the minimum required SIR on the reverse channels to minimize the total system reverse output power, during both call/connection establishment and while the call/connection is in progress. The ARPC recursive process shown in FIG. 4 begins at step 401 where the RCS modem forms the two error signals $e_1$ and $e_2$ in step 401 where $$e_1 = P_d - (1 + SNR_{REQ})P_N \quad (6)$$

$$e_2 = P_{rt} - P_o \quad (7)$$

SIR and Multiple Channel Types

The required SIR for channels on a link is a function of channel format (e.g. TRCH, OW). service type (e.g. ISDN B, 32 kb/s ADPCM POTS) and the number of symbols over which data bits are distributed (e.g. two 64 kb/s symbols are integrated to form a single 32 kb/s ADPCM POTS symbol). Despreader output power corresponding to the required SIR for each channel and service type is predetermined. While a call/connection is in progress, several user CDMA logical channels are concurrently active; each of these channels transfers a symbol every symbol period. The SIR of the symbol from the nominally highest SIR channel is measured, compared to a threshold and used to determine the APC step up/down decision each symbol period. Table 2 indicates the symbol (and threshold) used for the APC computation by service and call type.

APC Parameters

APC information is always conveyed as a single bit of information, and the APC Data Rate is equivalent to the APC Update Rate. The APC update rate is 64 kb/s. This rate is high enough to accommodate expected Rayleigh and Doppler fades, and allow for a relatively high (~0.2) Bit Error Rate (BER) in the Uplink and Downlink APC channels, which minimizes capacity devoted to the APC.

The power step up/down indicated by an APC bit is nominally between 0.1 and 0.01 dB. The dynamic range for power control is 70 dB on the reverse link and 12 dB on the forward link for the exemplary embodiment of the present system. and $P_d$ is the despread signal plus noise power, $P_N$ is the despread noise power. $SNR_{REF}$ is the reference signal to noise ratio for the service type, $P_{rt}$ is a measure of the average total power received by the RCS, and $P_o$ is the AGC set point. The RCS modem forms the combined error signal $\alpha_1 e_1 + \alpha_2 e_2$ in step 402 and hard limits this error signal to determine a single APC bit in step 403. The RCS transmits the APC bit to the SU in step 404, and the bit is received by the SU in step 405. Finally, SU adjusts its transmit power according to the received APC bit in step 406, and the process repeats starting from step 401.

TABLE 2

Symbols/Thresholds Used for APC Computation

| Service or Call Type | Call/Connection Status | Symbol (and Threshold) Used for APC Decision |
| --- | --- | --- |
| Don't care | Being Established | AXCH |
| ISDN D SU | In-Progress | one 1/64-KBPS symbol from TRCH (ISDN-D) |
| ISDN 1B + D SU | In-Progress | TRCH (ISDN-B) |
| ISDN 2B + D SU | In-Progress | TRCH (one ISDN-B) |
| POTS SU (64 KBPS PCM) | In-Progress | one 1/64-KBPS symbol from TRCH, use 64 KBPS PCM threshold |
| POTS SU (32 KBPS ADPCM) | In-Progress | one 1/64-KBPS symbol from TRCH, use 32 KBPS ADPCM threshold |
| Silent Maintenance Call (any SU) | In-Progress | OW (continuous during a maintenance call) |

An Alternative Embodiment for Multiplexing APC Information

The dedicated APC and OW logical channels described previously can also be multiplexed together in one logical channel. The APC information is transmitted at 64 kb/s. continuously whereas the OW information occurs in data bursts. The alternative multiplexed logical channel includes the unencoded, non-interleaved 64 kb/s. APC information on, for example, the In-phase channel and the OW information on the quadrature channel of the QPSK signal.

Closed Loop Power Control Implementation

The closed loop power control during a call connection responds to two different variations in overall system power. First, the system responds to local behavior such as changes in power level of an SU, and second, the system responds to changes in the power level of the entire group of active users in the system.

Figure 5A:
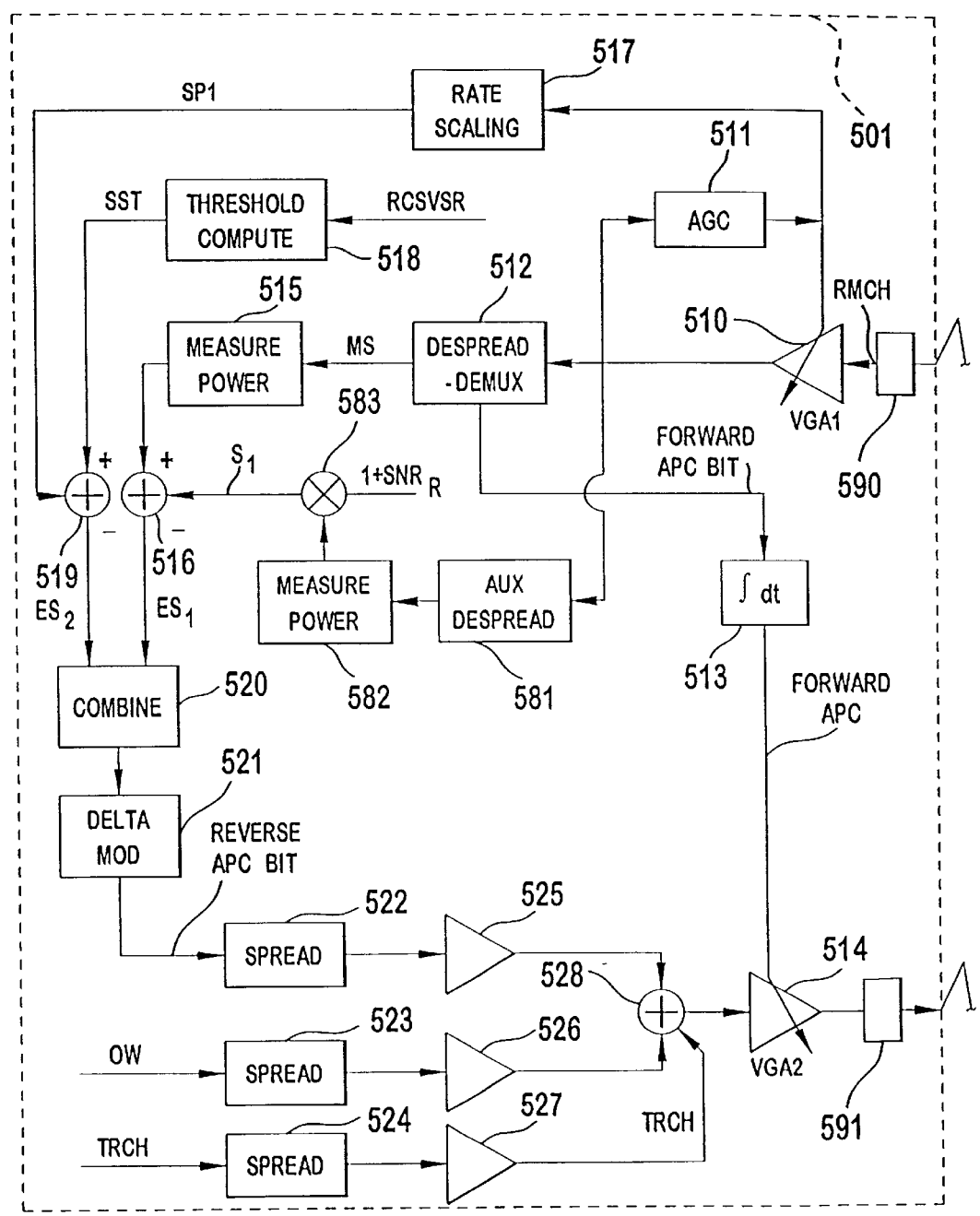
FIG. 5A and FIG. 5B is a block diagram of an exemplary closed loop power control system of the present invention when the bearer channel is established.
Figure 5B:
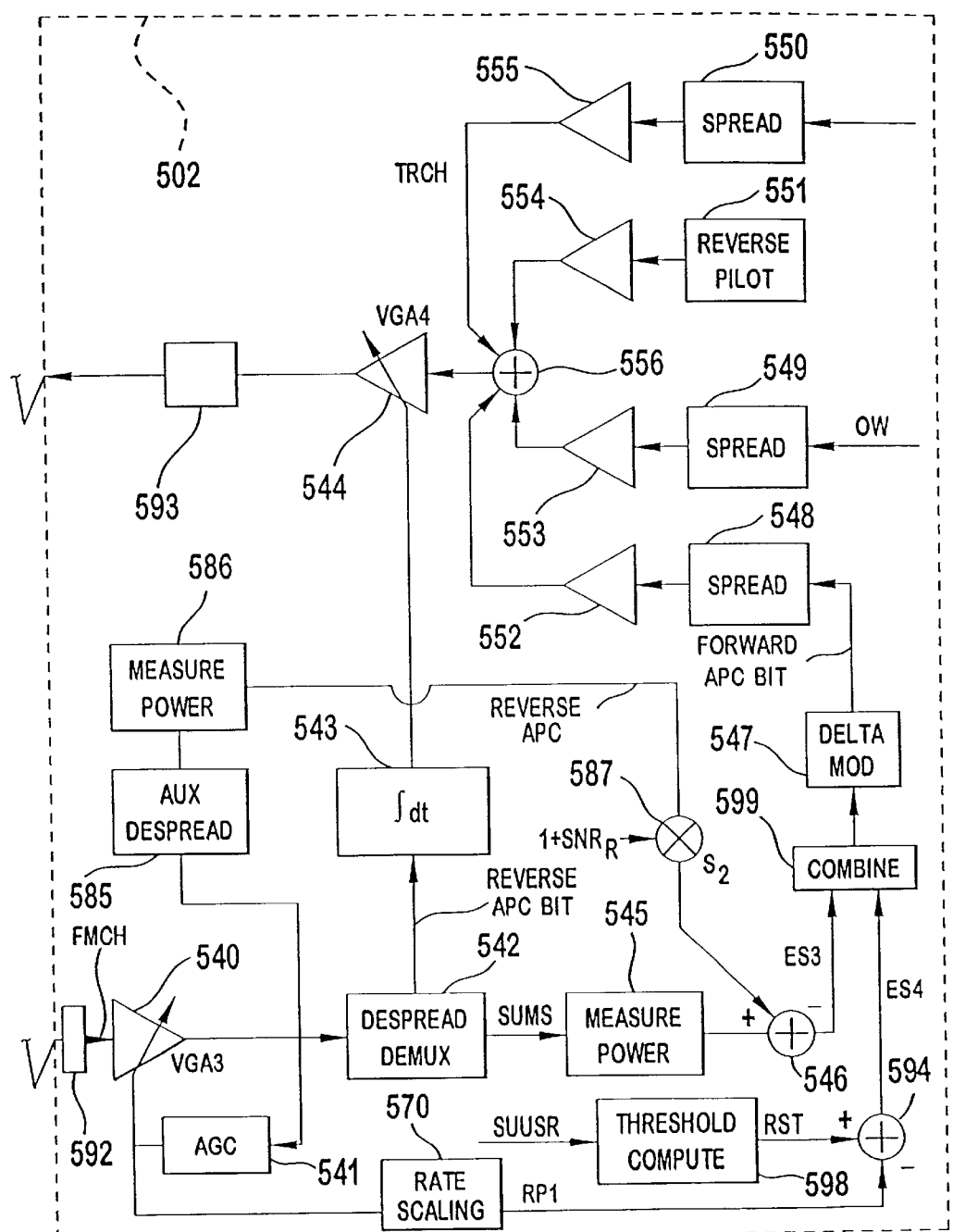

The Power Control system of the exemplary embodiment of the present invention is shown in FIG. 5A and FIG. 5B. As shown, the circuitry used to adjust the transmitted power is similar for the RCS (shown as the RCS power control module 501) and SU (shown as the SU power control module 502). Beginning with the RCS power control module 501, the reverse link RF channel signal is received at the RF antenna 590 and demodulated to produce the reverse CDMA signal RMCH which is applied to the variable gain amplifier (VGA1) 510. The output signal of VGA1 510 is provided to the Automatic Gain Control (AGC) Circuit 511 which produces a variable gain amplifier control signal into the VGA1 510. This signal maintains the level or the output signal of VGA1 510 at a near constant value. The output signal of VGA1 is despread by the despread-demultiplexer (demux) 512 which produces a despread user message signal MS and a forward APC bit. The forward APC bit is applied to the integrator 513 to produce the Forward APC control signal. The Forward APC control signal controls the Forward Link VGA2 514 and maintains the Forward Link RF channel signal at a minimum level necessary for communication.

The signal power of the despread user message signal MS of the RCS power module 501 is measured by the power measurement circuit 515 to produce a signal power indication. The output of the VGA1 is also despread by the AUX despreader 581 which despreads the signal by using an uncorrelated spreading code, and hence obtains a despread noise signal. The power measurement taken at power measurement device 582 of this signal is multiplied at multiplier 583 by 1 plus the required signal to noise ratio ($SNR_R$) to form the threshold signal S1. The difference between the despread signal power and the threshold value S1 is produced by the subtracter 516. This difference is the error signal ES1 which is an error signal relating to the particular SU transmit power level. Similarly the control signal for the VGA1 510 is applied to the rate scaling circuit 517 to reduce the rate of the control signal for VGA1 510. The output signal of scaling circuit 517 is a scaled system power level signal SP1. The Threshold Compute logic 518 computes the System Signal Threshold SST value from the RCS user channel power data signal (RCSUSR). The complement of the Scaled system power level signal, SP1, and the System Signal Power Threshold value SST are applied to the adder 519 which produces second error signal ES2. This error signal is related to the system transmit power level of all active SUs. The input Error signals ES1 and ES2 are combined in the combiner 520 produce a combined error signal input to the delta modulator (DM1) 521, and the output signal of the DM1 is the reverse APC bit stream signal, having bits of value +1 or −1, which for the present invention is transmitted as a 64 kb/sec signal.

The Reverse APC bit is applied to the spreading circuit 522 and the output signal of the spreading circuit 522 is the spread-spectrum forward APC message signal. Forward OW and Traffic signals are also provided to spreading circuits 523, 524, producing forward traffic message signals 1, 2, ... N. The power level of the forward APC signal, the forward OW, and traffic message signals are adjusted by the respective amplifiers 525, 526 and 527 to produce the power level adjusted forward APC, OW, and TRCH channels signals. These signals are combined by the adder 528 and applied to the VAG2 514, which produces forward link RF channel signal. The forward link RF channel signal is transmitted by transmitter 591.

The forward link RF channel signal including the spread forward APC signal is received by the RF antenna 592 of the SU, and demodulated to produce the forward CDMA signal FMCH. This signal is provided to the variable gain amplifier (VGA3) 540. The output signal of VGA3 is applied to the Automatic Gain Control Circuit (AGC) 541 which produces a variable gain amplifier control signal to VGA3 540. This signal maintains the level of the output signal of VGA3 at a near constant level. The output signal of VAG3 540 is despread by the despread demux 542, which produces a despread user message signal SUMS and a reverse APC bit. The reverse APC bit is applied to the integrator 543 which produces the Reverse APC control signal. This reverse APC control signal is provided to the Reverse APC VGA4 544 to maintain the Reverse link RF channel signal at a minimum power level.

The despread user message signal SUMS is also applied to the power measurement circuit 545 producing a power measurement signal which is added to the complement of threshold value S2 in the adder 546 to produce error signal ES3. The signal ES3 is an error signal relating to the RCS transmit power level for the particular SU. To obtain threshold S2, the despread noise power indication at measure power device 586 from the AUX despreader 585 is multiplied at multiplier 587 by 1 plus the desired signal lo noise ratio $SNR_R$. The AUX despreader 585 despreads the input data using an uncorrelated spreading code, hence its output is an indication of the despread noise power.

Similarly, the control signal for the VGA3 is applied to the rate scaling circuit 570 to reduce the rate of the control signal for VGA3 in order to produce a scaled received power level RP1 (see FIG. 5A and FIG. 5B). The threshold compute 598 circuit computes the received signal threshold RST from SU measured power signal SUUSR. The complement of the scaled received power level RP1 and the received signal threshold RST are applied to the adder 594 which produces error signal ES4. This error is related to the RCS transmit power to all other SUs. The input error signals ES3 and ES4 are combined in the combiner 599 and input to the delta modulator DM2 547, and the output signal of DM2 547 is the forward APC bit stream signal, with bits having value of value +1 or −1. In the exemplary embodiment of the present invention this signal is transmitted as a 64 kb/sec signal.

The Forward APC bit stream signal is applied to the spreading circuit 2948 to produce the output reverse spread-spectrum APC signal. Reverse OW and Traffic signals are also input to spreading circuits 549, 550, producing reverse OW and traffic message signals 1, 2 . . . N and the reverse pilot is generated by the reverse pilot generator 551. The power level of the reverse APC message signal reverse OW message signal, reverse pilot, and the reverse traffic message signals are adjusted by amplifiers 552, 553, 554, 555 to produce the signals which are combined by the adder 556 and input to the reverse APC VGA4 544. It is this VGA4 544 which produces the reverse link RF channel signal. The reverse link RF channel signal is transmitted by transmitter 593.

Figure 6A:
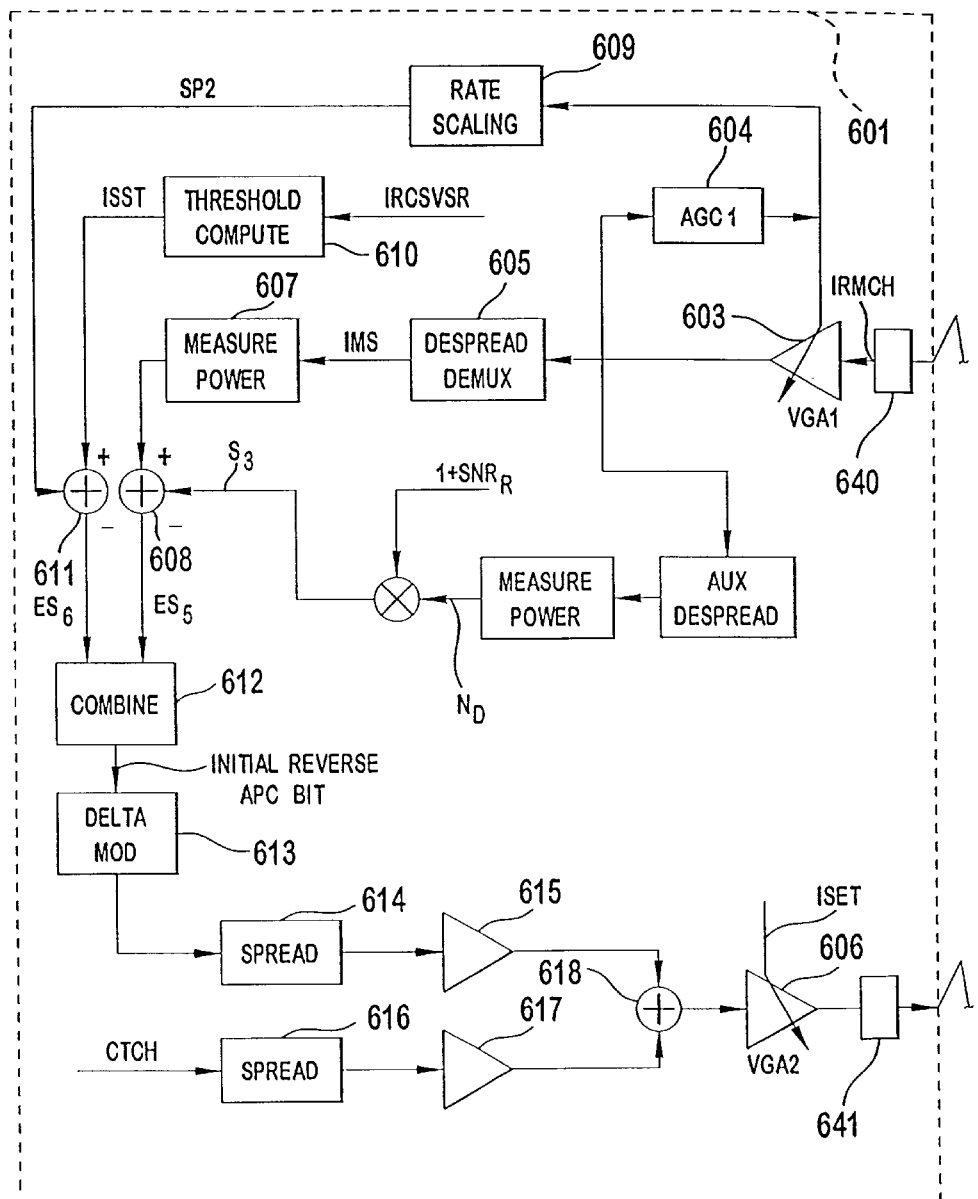
FIG. 6A and FIG. 6B is a block diagram of an exemplary closed loop power control system of the present invention during the process of establishing the bearer channel.
Figure 6B:
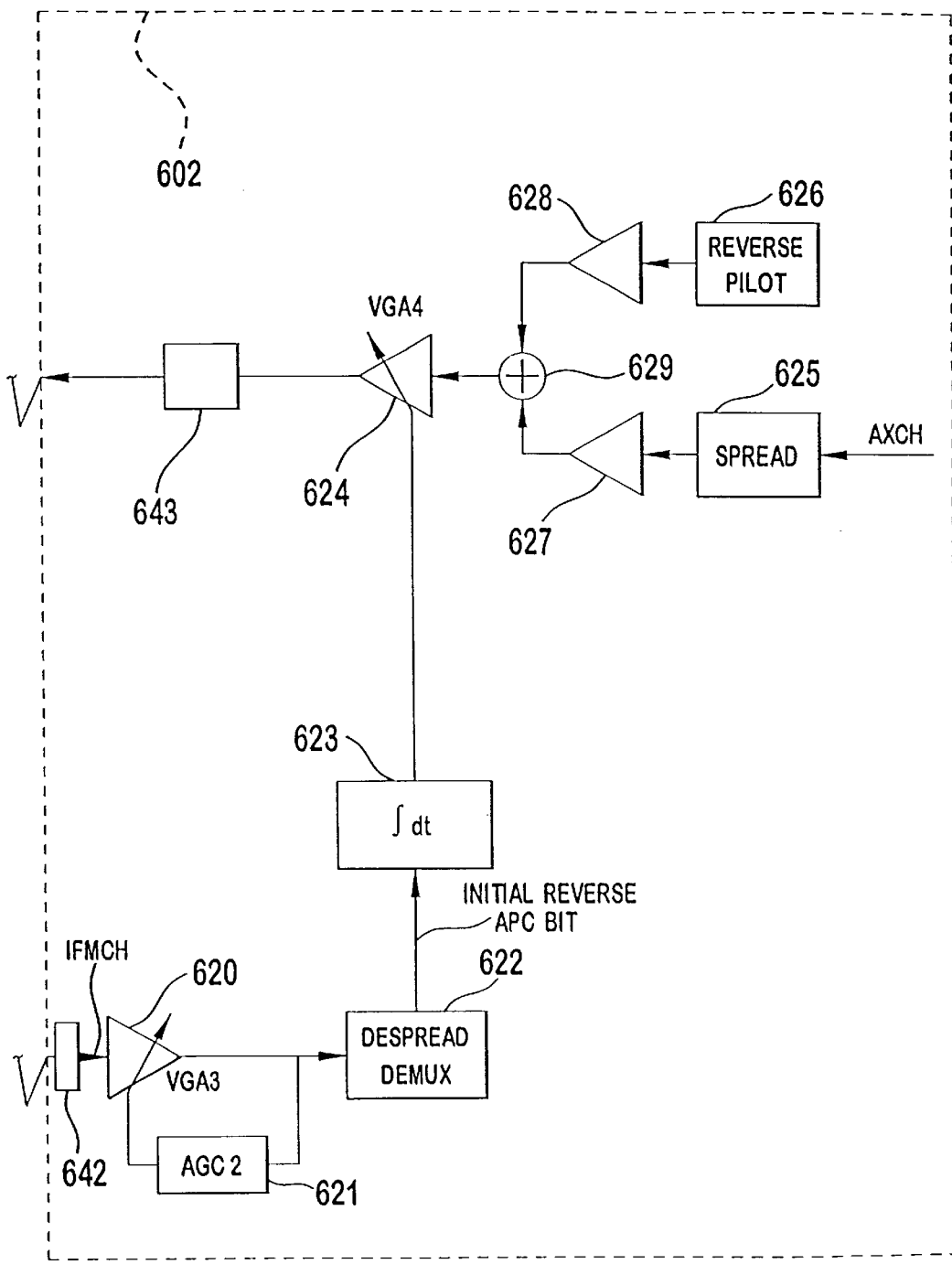

During the call connection and bearer channel establishment process, the closed loop power control of the present invention is modified, and is shown in FIG. 6A and FIG. 6B. As shown, the circuits used to adjust the transmitted power are different for the RCS, shown as the Initial RCS power control module 601; and for the SU, shown as the Initial SU power control module 602. Beginning with the Initial RCS power control module 601, the reverse link RF channel signal is received at the RF antenna 640 and demodulated producing the reverse CDMA signal IRMCH which is received by the first variable gain amplifier (VGA 1) 603. The output signal of VGA1 is detected by the Automatic Gain Control Circuit (AGC1) 604 which provides a variable gain amplifier control signal to VGA1 603 to maintain the level of the output signal of VAG1 at a near constant value. The output signal of VGA1 is despread by the despread demultiplexer 605 which produces a despread user message signal IMS. The Forward APC control signal, ISET, is set to a fixed value, and is applied to the Forward Link Variable Gain Amplifier (VGA2) 606 to set the Forward Link RF channel signal at a predetermined level.

The signal power of the despread user message signal IMS of the Initial RCS power module 601 is measured by the power measure circuit 607, and the output power measurement is subtracted from a threshold value S3 in the subtracter 608 to produce error signal ES5 which is an error signal relating to the transmit power level of a particular SU. The threshold S3 is calculated by multiplying at multiplier 652 the despread power measurement at measure power device 651 obtained from the AUX despreader 650 by 1 plus the desired signal to noise ratio SNR. The AUX despreader 650 despreads the signal using an uncorrelated spreading code, hence its output signal is an indication of despread noise power. Similarly, the VGA1 control signal is applied to the rate scaling circuit 609 to reduce the rate of the VGA1 control signal in order to produce a scaled system power level signal SP2. The threshold computation logic 610 determines an Initial System Signal Threshold value (ISST) computed from the user channel power data signal (IRCSUSR). The complement of the scaled system power level signal SP2 and the (ISST) are provided to the adder 611 which produces a second error signal ES6, which is an error signal relating to the system transmit power level of all active SUs. The value of ISST is the desired transmit power for a system having the particular configuration. The input Error signals ES5 and ES6 are combined in the combiner 612 produce a combined error signal input to the delta modulator (DM3) 613. DM3 produces the initial reverse APC bit stream signal, having bits of value +1 or −1, which for the present invention is transmitted as a 64 kb/sec signal.

The Reverse APC bit stream signal is applied to the spreading circuit 614. to produce the initial spread-spectrum forward APC signal. The control channel (CTCH) information is spread by the spreader 616 to form the spread CTCH message signal. The spread APC and CTCH signals are scaled by the amplifiers 615 and 617 and combined by the combiner 618. The combined signal is applied to VAG2 606 which produces the forward link RF channel signal. The forward link RF channel signal is transmitted by transmitter 641.

The forward link RF channel signal including the spread forward APC signal is received by the RF antenna 642 of the SU and demodulated to produce the initial forward CDMA signal (IFMCH) which is applied to the variable gain amplifier (VGA3) 620. The output signal of VGA3 is detected by the Automatic Gain Control Circuit (AGC2) 621 which produces a variable gain amplifier control signal for the VGA3 620. This signal maintains the output power level of the VGA3 620 at a near constant value. The output signal of VAG3 is despread by the despread demultiplexer 622 which produces an initial reverse APC bit that is dependent on the output level of VGA3. The reverse APC bit is processed by the integrator 623 to produce the Reverse APC control signal. The Reverse APC control signal is provided to the Reverse APC VGA4 624 to maintain Reverse link RF channel signal at a defined power level the reverse link RF channel signal is transmitted by transmitter 643.

The global channel AXCH signal is spread by the spreading circuits 625 to provide the spread AXCH channel signal. The reverse pilot generator 626 provides a reverse pilot signal, and the signal power of AXCH and the reverse pilot signal are adjusted by the respective amplifiers 627 and 628. The spread AXCH channel signal and the reverse pilot signal are added by the adder 629 to produce reverse link CDMA signal. The reverse link CDMA signal is received by the reverse APC VGA4 624, which produces the reverse link RF channel signal output to the RF transmitter.

System Capacity Management

The system capacity management algorithm of the present invention optimizes the maximum user capacity for an RCS area, called a cell. When the SU comes within a certain value of maximum transmit power, the SU sends an alarm message to the RCS. The RCS sets the traffic lights which control access to the system, to "red" which, as previously described, is a flag that inhibits access by the SU's. This condition remains in effect until the alarming SU terminates its call, or until the transmit power of the alarming SU, measured at the SU, is a value less than the maximum transmit power. When multiple SUs send alarm messages, the condition remains in effect until either all calls from alarming SUs terminate, or until the transmit power of the alarming SU, measured at the SU, is a value less than the maximum transmit power. An alternative embodiment measures the bit error rate measurements from the Forward Error Correction (FEC) decoder, and holds the RCS traffic lights at "red" until the bit error rate is less than a predetermined value.

The blocking strategy of the present invention includes a method which uses the power control information transmitted from the RCS to an SU, and the received power measurements at the RCS. The RCS measures its transmit power level, detects that a maximum value is reached, and determines when to block new users. An SU preparing to enter the system blocks itself if the SU reaches the maximum transmit power before successful completion of a bearer channel assignment.

Each additional user in the system has the effect of increasing the noise level for all other users, which decreases the signal to noise ratio (SNR) that each user experiences. The power control algorithm maintains a desired SNR for each user. Therefore, in the absence of any other limitations, addition of a new user into the system has only a transient effect and the desired SNR is regained.

The transmit power measurement at the RCS is done by measuring either the root mean square (rms) value of the baseband combined signal or by measuring the transmit power of the RF signal and feeding it back to digital control circuits. The transmit power measurement may also be made by the SUs to determine if the unit has reached its maximum transmit power. The SU transmit power level is determined by measuring the control signal of the RF amplifier, and scaling the value based on the service type, such as plain old telephone service (POTS), FAX, or integrated services digital network (ISDN).

The information that an SU has reached the maximum power is transmitted to the RCS by the SU in a message on the Assigned Channels. The RCS also determines the condition by measuring reverse APC changes because, if the RCS sends APC messages to the SU to increase SU transmit power, and the SU transmit power measured at the RCS is not increased, the SU has reached the maximum transmit power.

The RCS does not use traffic lights to block new users who have finished ramping-up using the short codes. These users are blocked by denying them the dial tone and letting them time out. The RCS sends all 1's (go down commands) on the APC Channel to make the SU lower its transmit power. The RCS also sends either no CTCH message or a message with an invalid address which would force the FSU to abandon the access procedure and start over. The SU does not start the acquisition process immediately because the traffic lights are red.

When the RCS reaches its transmit power limit, it enforces blocking in the same manner as when an SU reaches its transmit power limit. The RCS turns off all the traffic lights on the FBCH, starts sending all 1 APC bits (go down commands) to those users who have completed their short code ramp-up but have not yet been given dial tone, and either sends no CTCH message to these users or sends messages with invalid addresses to force them to abandon the access process.

The self blocking algorithm of the SU is as follows. When the SU starts transmitting the AXCH, the APC starts its power control operation using the AXCH and the SU transmit power increases. While the transmit power is increasing under the control of the APC, it is monitored by the SU controller. If the transmit power limit is reached, the SU abandons the access procedure and starts over.

Although the invention has been described in terms of an exemplary embodiment, it is understood by those skilled in the art that the invention may be practiced with modifications to the embodiment that are within the scope of the invention as defined by the following claims:

What is claimed is:

1. A method of communication data signal blocking for a base radio control station (RCS) which conducts wireless communication with subscriber units (SUs) in a spread spectrum communication system using code division multiple access, the method comprising:

providing a transmitter for transmitting signals over global and assigned channels to SUs which are initialized at initial power levels and adjusted to controlled power levels in advance of transmitting communication data signals on assigned channels to SUs which power levels combine to define an RCS transmitter power level, said transmitter transmitting signals as a baseband combined signal;

controlling the power levels of said transmitter signals to adjust the signal power levels in response to corresponding power control signals received from the SUs; and monitoring a root mean square value of the baseband combined signal as the RCS transmitter power level and controlling the transmitter such that transmission of a new communication data signal on an assigned channel is blocked if a predetermined RCS transmitter power level limit is reached before commencing transmission of the new communication data signal.

2. The method of claim 1 wherein said transmitter transmits signals as a combined RF signal and a transmission power level the RF signal is monitored as the RCS transmitter power level.

3. The method of claim 1 wherein said transmitter transmits power control signals to adjust SU transmission power levels, the method further comprising the steps of:

monitoring signal power levels of signals received from an SU in advance of transmitting a communication data signal on an assigned channel to that SU to determine if power control signals transmitted to that SU have been implemented; and controlling the transmitter such that transmission of a communication data signal on an assigned channel to that SU is blocked if it is determined that a power control signal to increase signal power of that SU has not been implemented before commencing transmission of the communication data signal on the assigned channel to that SU.

4. The method of claim 3 wherein said transmitter is configured to transmit a plurality of types of communication data signals including plain old telephone service (POTS), FAX and integrated services digital network (ISDN) and transmits power control signals to adjust SU transmission power levels on a global channel.

5. The method of claim 3 wherein said transmitter transmits signals as a combined RF signal and a transmission power level the RF signal is monitored as the RCS transmitter power level.

6. The method of claim 1 wherein said transmitter is configured to transmit a plurality of types of communication data signals including plain old telephone service (POTS), FAX and integrated services digital network (ISDN) on assigned channels by first providing a dial tone in conjunction with channel assignment, and said blocking the transmission of a new communication data signal on an assigned channel is done if a predetermined RCS transmitter power level limit is reached before a dial tone is provided.

7. The method of claim 6 wherein said transmitter transmits signals as a combined RF signal and a transmission power level the RF signal is monitored as the RCS transmitter power level.

8. A base radio control station (RCS) having subscriber unit (SU) blocking control for wireless communication with multiple SUs in a spread spectrum communication system using code division multiple access, the RCS comprising:

a transmitter for transmitting signals over global and assigned channels to SUs which are initialized at initial power levels and adjusted to controlled power levels in advance of transmitting communication data signals on assigned channels to SUs which power levels combine to define an RCS transmitter power level, said transmitter transmitting signals as a baseband combined signal;

a receiver and associated circuitry for controlling the power levels of said transmitter signals;

said receiver and associated circuitry configured to adjust the signal power levels in response to corresponding power control signals received from the SUs; and control circuitry for monitoring the RCS transmitter power level and controlling the transmitter such that transmission of a new communication data signal on an assigned channel is blocked if a predetermined RCS transmitter power level limit is reached before commencing transmission of the new communication data signal, said control circuitry monitoring a root mean square value of the baseband combined signal as the RCS transmitter power level.

9. The RCS of claim 8 wherein said transmitter transmits signals as a combined RF signal and said control circuitry monitors a transmission power level the RF signal as the RCS transmitter power level.

10. The RCS of claim 8 wherein:

said transmitter is configured to transmit power control signals to adjust SU transmission power levels; and said receiver and associated circuitry is configured to monitor signal power levels of signals received from an SU in advance of transmitting a communication data signal on an assigned channel to that SU to determine if power control signals transmitted to that SU have been implemented and to control said transmitter such that transmission of a communication data signal on an assigned channel to that SU is blocked if it is determined that a power control signal to increase signal power of that SU has not been implemented before commencing transmission of the communication data signal on the assigned channel to that SU.

11. The RCS of claim 10 wherein said transmitter is configured to transmit a plurality of types of communication data signals including plain old telephone service (POTS), FAX and integrated services digital network (ISDN).

12. The RCS of claim 10 wherein said transmitter is configured to transmit power control signals to adjust SU transmission power levels on a global channel.

13. The RCS of claim 10 wherein said transmitter transmits signals as a combined RF signal and said control circuitry monitors a transmission power level the RF signal as the RCS transmitter power level.

14. The RCS of claim 8 wherein said transmitter is configured to transmit a plurality of types of communication data signals including plain old telephone service (POTS), FAX and integrated services digital network (ISDN) on assigned channels by first providing a dial tone in conjunction with channel assignment, and said control circuitry blocks the transmission of a new communication data signal on an assigned channel if a predetermined RCS transmitter power level limit is reached before a dial tone is provided.

* * * * *

UNITED STATES PATENT AND TRADEMARK OFFICE
CERTIFICATE OF CORRECTION

PATENT NO. : 6,674,788 B2
DATED : January 6, 2004
INVENTOR(S) : Lomp et al.

It is certified that error appears in the above-identified patent and that said Letters Patent is hereby corrected as shown below:

Title page,
Item [75], Inventors, after the name "Gary Lomp," delete "Centerpot" and insert therefore -- Centerport --.
Item [63], Related U.S. Application Data, after the phrase "which is a continuation of application No. 09/406,162," delete "filed on Sep. 27, 2001" and insert therefor -- filed on Sep. 27, 1999 --.
Item [56], References Cited, OTHER PUBLICATIONS, insert -- Raymond W. Nettleton, "Spectral Efficiency in Cellular Land-Mobile Communications: A Spread-Spectrum Approach," UMI Dissertation Information Service, (1978) 204 pp. --

Column 4,
Line 52, delete "(concerning" and insert therefor -- concerning --.

Column 12,
Line 50, after the word "the", delete "VAG2" and insert therefor -- VGA2 --.
Line 61, after the word "of", delete "VAG3" and insert therefor -- VGA3 --.

Column 13,
Line 9, after the word "signal", delete "lo" and insert therefor -- to --.
Line 57, after the second instance of the word "of", delete "VAG1" and insert therefor -- VGA1 --.

Column 14,
Line 45, after the word "of", delete "VAG3" and insert therefor -- VGA3 --.

Signed and Sealed this

Twenty-seventh Day of July, 2004

JON W. DUDAS
*Acting Director of the United States Patent and Trademark Office*